(12) United States Patent
Zhang et al.

(10) Patent No.: US 8,741,676 B2
(45) Date of Patent: Jun. 3, 2014

(54) METHOD OF MANUFACTURING OLED-ON-SILICON

(75) Inventors: Dong Zhang, Sarawak (MY); Sang Sool Koo, Sarawak (MY)

(73) Assignee: X-FAB Semiconductor Foundries AG (DE)

( * ) Notice: Subject to any disclaimer, the term of this patent is extended or adjusted under 35 U.S.C. 154(b) by 0 days.

(21) Appl. No.: 13/264,209

(22) PCT Filed: Apr. 16, 2009

(86) PCT No.: PCT/EP2009/054535
§ 371 (c)(1),
(2), (4) Date: Oct. 27, 2011

(87) PCT Pub. No.: WO2010/118776
PCT Pub. Date: Oct. 21, 2010

(65) Prior Publication Data
US 2012/0032204 A1 Feb. 9, 2012

(51) Int. Cl.
*H01L 21/00* (2006.01)
(52) U.S. Cl.
USPC ........................ 438/34; 257/88; 257/E33.062
(58) Field of Classification Search
USPC ....................... 438/29, 69, 82, 99, 34; 257/40,
257/642–643, 759, E51.001–E51.052,
257/E25.008–E25.009, 88, E33.62
See application file for complete search history.

(56) References Cited

U.S. PATENT DOCUMENTS

| | | |
|---|---|---|
| 2004/0075385 A1 | 4/2004 | Tao |
| 2006/0124986 A1 | 6/2006 | Lee |
| 2007/0007533 A1 | 1/2007 | Wu et al. |
| 2007/0026679 A1 | 2/2007 | Yu et al. |
| 2007/0287211 A1 | 12/2007 | Wu |

OTHER PUBLICATIONS

PCT, International Search Report and Written Opinion, PCT/EP2009/054535 (Dec. 18, 2009).

*Primary Examiner* — Tony Tran
(74) *Attorney, Agent, or Firm* — Thompson Hine L.L.P.

(57) ABSTRACT

A method of manufacturing an Organic Light Emitting Diode (OLED). A substrate (101) is provided, and a plurality of pixel electrodes (102) is formed on the substrate resulting in at least one gap (105) between two adjacent pixel electrodes. A dielectric material (103) is deposited in the gap. The resulting structure is subjected to a process which ensures that at least a portion of the surface of the pixel electrodes is not covered by the dielectric material. At least the portion of the surface of the pixel electrodes is covered with a layer of an organic compound so as to form the OLED.

15 Claims, 2 Drawing Sheets

METHOD OF MANUFACTURING OLED-ON-SILICON

The present invention relates to a method of fabricating an organic light emitter on integrated circuits, and in particular to fabricating the electrodes of an organic light emitter using the metals of integrated circuits such as used in a MOS or bipolar technique.

BACKGROUND

In recent years, many applications have been found for the integration of organic light emitting diodes (OLED) with standard CMOS circuits, for example in near-to-eyes lenses. The integration of OLED and CMOS into the same chip can provide many benefits, such as compact size, fast speed, low power consumption etc.

In a typical OLED on MOS structure for use as a display, a wafer (e.g. a silicon wafer) having an integrated circuit is provided. Metal pixels are photolithographically patterned on the top of the wafer. An organic compound layer is then formed on top, covering the metal pixels as well as the gaps between the metal pixels.

However, the present inventors have appreciated that problems may arise since the standard CMOS process is not well suited to the integration of OLED on CMOS, for at least two reasons. Firstly, the typical metal deposition techniques often do not result in a smooth surface with a surface roughness of less than 3 nm, for the application of OLED electrodes. The roughness of the surface of the OLED bottom electrodes (i.e. of the top surface of the metal pixel) is believed to cause the lifetime of the OLED to shorten. Secondly, the thickness of metals employed in CMOS processes is commonly more than 6000 Å (600 nm), with the result that the pixel gaps (or metal gaps) are deeper. OLED organic materials deposited in the metal gaps can induce side wall emitting and high electrical fields at the metal edge. As a result, both the efficiency and reliability of the OLED device is degraded.

To address these problems it is in principle possible to reduce the thickness of the metal used for forming the electrodes of the OLED, and the roughness could to be optimized by adjusting the metal deposition parameters such as power, temperature and deposition rate. Nonetheless, the existing solutions address the problems only in part, or introduce further problems. Firstly, there are limitations as to how much the thickness of the electrodes can be reduced. A very thin aluminium film does not have a good reflectivity over the entire visible light range. Secondly, an over etch is normally necessary to ensure that no metal bridges remain between adjacent pixels, and this also limits the reduction of the inter-metal gap depth owing to variations in the metal thickness. Thirdly, by reducing the thickness of the OLED electrodes, the OLED efficiency and reliability degradation can only be alleviated to some extent, but not completely prevented.

SUMMARY

It is an aim of at least preferred embodiments of the present invention to address the above problems whilst retaining the benefits of low cost and high OLED performance.

More specifically, it is an aim of at least preferred embodiments of the present invention to provide a new method of fabricating OLED on integrated circuits, whereby the roughness of the OLED electrode surface is improved and the pixel gap depth is reduced, preferably significantly reduced or eliminated altogether.

Accordingly, in a first aspect the present invention provides a method of manufacturing an Organic Light Emitting Diode (OLED) comprising:
 providing a substrate;
 forming a plurality of pixel electrodes on the substrate resulting in at least one gap between two adjacent pixel electrodes;
 depositing a dielectric material in the gap;
 subjecting the resulting structure to a process which ensures that at least a portion of the surface of said pixel electrodes is not covered by said dielectric material; and
 covering at least said portion of said surface of said pixel electrodes with a layer of an organic compound so as to form said OLED.

In a specific embodiment, the present invention provides a method of filling the inter pixel gaps with dielectric insulating materials, and a blank plasma etching process is employed to remove the insulating dielectric films on the top of OLED electrodes metals and leave at least a portion of dielectric insulating materials in the inter pixels gaps.

In certain embodiments the present technique comprises providing a silicon substrate including integrated circuits structures; forming a reflective metal or metal stacks on the wafer, whereby the metal or metal stacks preferably have a matched work function with the OLED organic materials which are to be deposited subsequently on the top of the metal or metal stacks; photolithographically patterning a photo resist layer formed on the metal layer(s) and etching the metal layer(s) to form pixel electrodes, forming an insulating dielectric layer(s) over the metal pixel electrodes; and carrying out a second plasma etching process to remove the insulating dielectric layer(s) on the top of metal pixels.

In other embodiments, a chemical mechanic polishing process is added before the second plasma etching process to flatten the insulating dielectric layer surface.

In further embodiments, a photolithography process is added before the second plasma etching process to pattern the region where the insulating dielectric layers will be removed.

According to a second aspect of the invention, there is provided an OLED manufactured according to the method described in the first aspect of the invention.

BRIEF DESCRIPTION OF THE DRAWINGS

Some preferred embodiments of the invention will now be described by way of example only and with reference to the accompanying drawings, in which.

DETAILED DESCRIPTION

Figure 1:
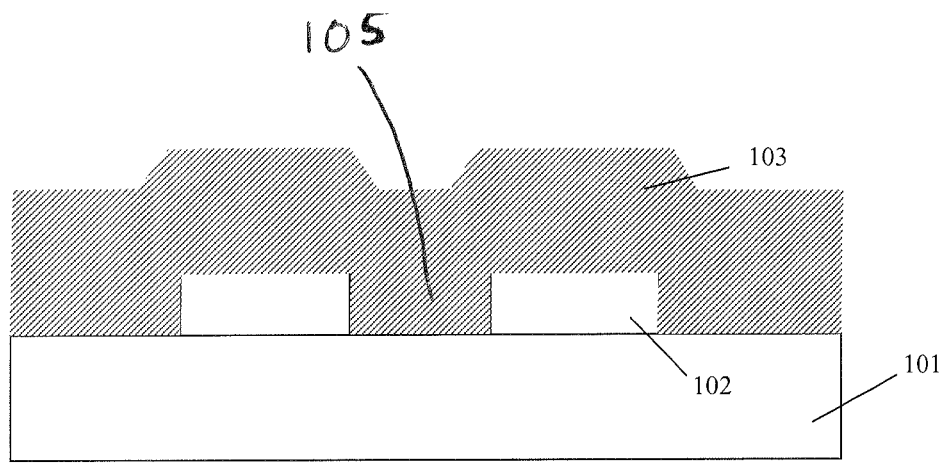
FIG. 1 shows a schematic cross sectional view of a portion of OLED display at one stage of the fabrication according to embodiments of the present invention.

As shown in FIG. 1, a wafer 101 having an integrated circuit is provided. The wafer 101 is a silicon wafer, for example. The integrated circuit is fabricated with CMOS technology in one example, and with BiCMOS in another example. Metal pixels 102 are photolithographically patterned on the top of the wafer, as is known in the art. The metal layer or layers constituting the pixels 102 may be fabricated using aluminium, titanium, tantalum, silver, titanium nitride or other suitable metallic or metal-containing material. In one embodiment, the metal pixels comprise multi-layers of Al film of 40 nanometers and a titanium nitride layer of 10 nanometers. The metal thickness can be chosen such that the roughness of the surface of the metal layer(s) is optimized, i.e. as smooth as possible.

An insulating dielectric layer 103 is then deposited on top of the metal pixels 102. Whilst only one dielectric layer 103 is shown in the drawings, it will be understood that this may be formed of several layers, but for ease of illustration this will be referred to as dielectric layer 103. The dielectric layer 103 fills the gap 105 between two adjacent metal pixels 102. The insulating dielectric layer is fabricated with silicon oxide, silicon nitride or photo resist, for example. The insulating dielectric layer may be fabricated by PECVD, HDPCVD and spin coating for example. It is preferred that the thickness of the insulating dielectric layer is sufficient so as to fill the inter pixel gap 105. In one example, an oxide layer of 80 nanometers was formed by HDPCVD on top of metal pixels consisting of titanium and aluminium of 50 nanometers.

As can be seen in FIG. 1, the top surface of the dielectric layer 103 is raised over the metal pixels 102.

Figure 2:
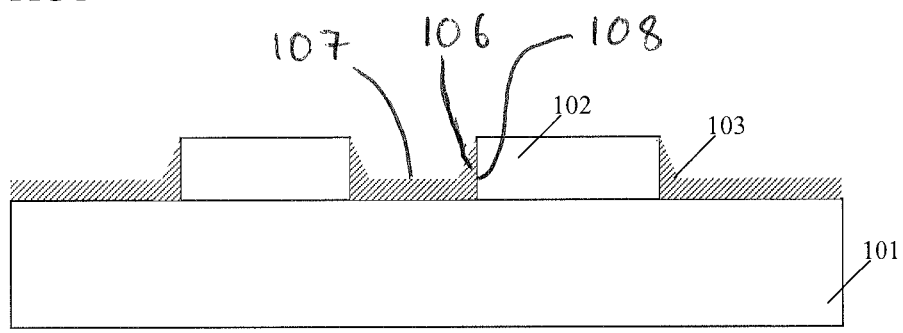
FIG. 2 shows a schematic cross sectional view of a portion of OLED display at a second stage of the fabrication according to a first embodiment of the present invention.

FIG. 2 shows the cross sectional view of the OLED display according to a first embodiment, after a blank plasma etching has been performed. A portion of the insulating dielectric layer 103 is deliberately retained in the central portion 107 of the pixel gap 105, albeit of smaller thickness than the pixel electrodes 102. Insulating dielectric spacers 106 are formed adjacent the edge of the pixel 102. It is preferred that the spacers 106 cover a major portion of the side wall of pixel 102.

In a variant it would be possible to remove all of the dielectric layer 103 in the central portion 107 of the pixel gap 105.

In a subsequent processing step (not shown) the top surface of the pixel electrodes 102 is covered with a layer of an organic compound in order to form the OLED, as is known in the art. The organic compound would normally also cover the dielectric layer 103 in the pixel gap 105.

Figure 3:
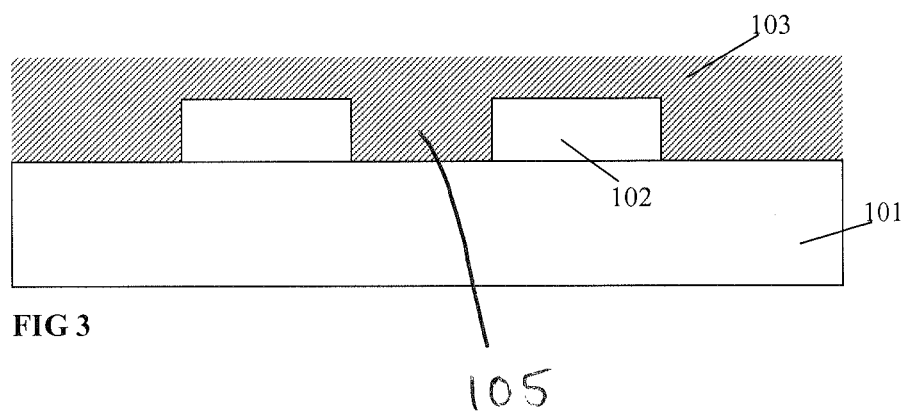
FIG. 3 shows a schematic cross sectional view of a portion of OLED display at a second stage of the fabrication according to a second embodiment of the present invention.
Figure 4:
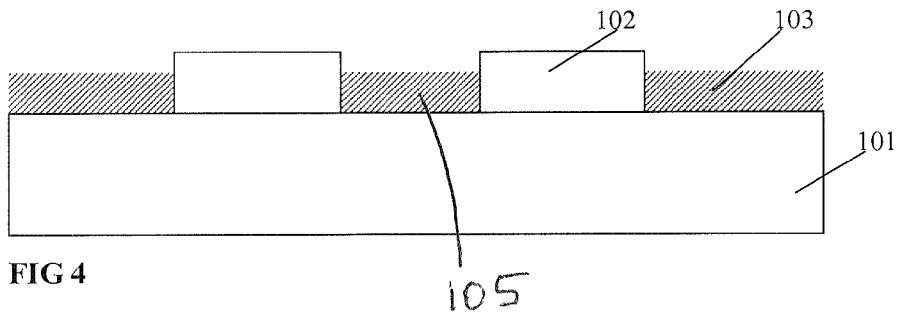
FIG. 4 shows a schematic cross sectional view of a portion of OLED display at a third stage of the fabrication according to the second embodiment of the present invention.

In a second embodiment, the initial processing is as explained with reference to FIG. 1. However, a polishing process is performed after the dielectric insulating film 103 has been deposited. The polishing process may be performed by chemical mechanical polishing (CMP), for example. The cross sectional view after the polishing process is shown in FIG. 3, which shows that the surface of the dielectric layer 103 has been flattened. After the polishing process, a blank etching process is performed, which removes the insulating dielectric layer 103 from the top of the pixel metal stops 103 on the metal surface until the top surface of the insulating dielectric layer 103 in the gap 105 and the top surface of the pixel electrodes 102 present a substantially smooth surface (not shown). In a variant, over etching is performed to guarantee that the oxide 103 is fully removed from the top of the metal surface 102. The cross sectional view after this (over) etching process is shown in FIG. 4. The step height between the metal pixel 102 and the dielectric layer 103 is controlled by the over etching.

Figure 5:
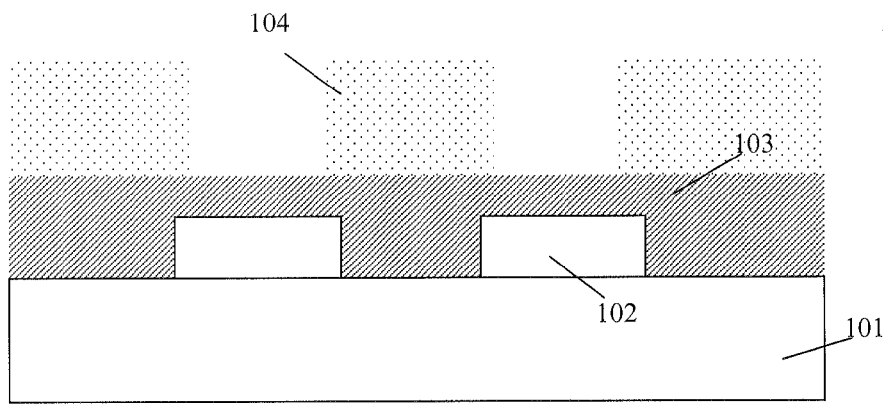
FIG. 5 shows a schematic cross sectional view of a portion of OLED display at a second stage of the fabrication according to a third embodiment of the present invention.
Figure 6:
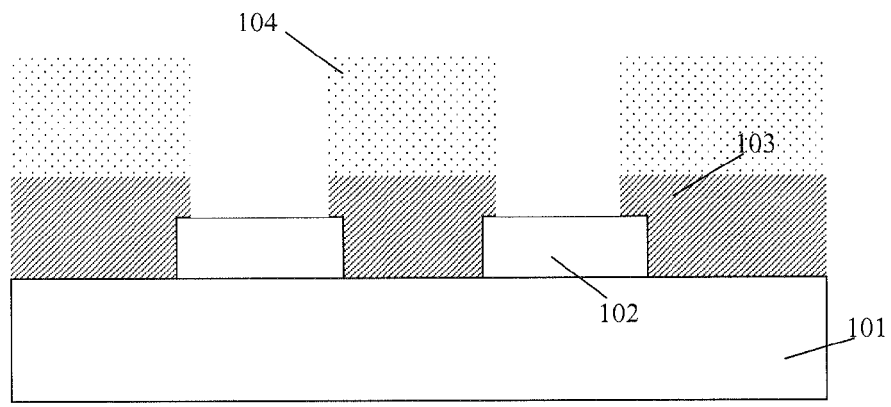
FIG. 6 shows a schematic cross sectional view of a portion of OLED display at a third stage of the fabrication according to the third embodiment of the present invention.

In a third embodiment, the initial processing is again as explained with reference to FIG. 1. A photolithography process is employed after the polishing process of the second embodiment, as shown in FIG. 5. This results in a mask 104 substantially covering the gap 105 and substantially leaving the space over the metal pixels 102 free. According to a variant, the photolithography process can instead be employed after insulting dielectric layer formation without any polishing process (as per FIG. 1). As shown in FIG. 6, the photo resist 104 is defined with a reverse mask of the metal pixels 102. A second plasma etching process is then applied to remove the dielectric layer 103 from the top of the metal pixels 102 (the first plasma etching process having been performed during the formation of the metal pixels 102).

Figure 7:
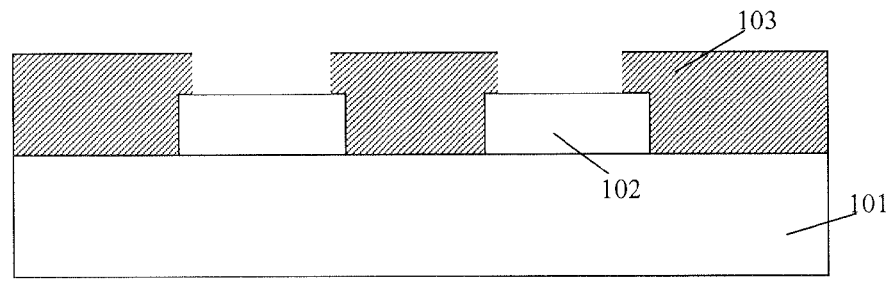
FIG. 7 shows a schematic cross sectional view of a portion of OLED display at a fourth stage of the fabrication according to the third embodiment of the present invention.

After the second plasma etching process, the mask 104 is removed to reveal the structure shown in FIG. 7, where the dielectric layer 103 in the gaps 105 is thicker than the pixel electrodes 102.

In a specific example, the dielectric film 103 can be formed by HDPCVD, for example. In another example the dielectric film 103 can be formed by PECVD. In one example, an oxide layer of 1000 Angstrom is formed by a PECVD process, with a substrate temperature in the range of 300 degrees C. to 450 degrees C. The deposition can be performed with a gas comprising $SiH_4$, $N_2O$ and $N_2$ at 5 Torr.

In a further example, the gas used for the second plasma etching process is $C_4F_8$, for example. The power may be chosen in the range of 300 W to 1000 W, for example. The pressure during etching is in the range of 30 to 40 mTorr, for example.

Preferred embodiments of the invention may have the advantage that the fabricated OLED on CMOS has improved or even excellent reliability and efficiency. Some embodiments have the further advantage that the process is cost-effective and that no additional mask is needed during the blank etch.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

What is claimed is:
1. A method of manufacturing an Organic Light Emitting Diode (OLED) comprising:
   providing a substrate;
   forming a plurality of pixel electrodes on the substrate resulting in at least one gap between two adjacent pixel electrodes;
   depositing a dielectric material in the gap;
   subjecting the resulting structure to an etching process which ensures that at least a portion of the surface of said pixel electrodes is not covered by said dielectric material, wherein the resulting structure is patterned before subjecting it to the etching; and covering at least said portion of said surface of said pixel electrodes with a layer of an organic compound so as to form said OLED;

wherein depositing the dielectric material in the gap comprises depositing the dielectric material over the pixel electrodes as well;

further comprising a polishing step between the depositing of the dielectric material in the gap and the subjecting the resulting structure to said process, the polishing step comprising chemical mechanical polishing (CMP);

wherein the patterning comprises applying a mask over the dielectric layer, the mask substantially covering said gap and leaving a space over said pixel electrodes, and the method comprises removing the mask over the dielectric layer substantially covering said gap prior to covering at least said portion of said surface of said pixel electrodes with the layer of the organic material.

2. A method according to claim 1, wherein the process is arranged to ensure that substantially none of the surface of said pixel electrodes is covered by said dielectric material.

3. A method according to claim 1, wherein depositing the dielectric material in the gap comprises substantially filling the gap.

4. A method according to claim 1, wherein said process comprises substantially completely removing the dielectric material over a portion of the surface of the gap.

5. A method according to claim 1, wherein said process comprises leaving spacers of said dielectric material immediately adjacent the pixel electrodes.

6. A method according to claim 5, wherein the spacers cover a substantial portion of the side walls of the pixel electrodes.

7. A method according to claim 1, wherein the etching comprises carrying out a blank etch.

8. A method according to claim 1, wherein the patterning comprises applying a mask, and the method comprises removing the mask prior to covering at least said portion of said surface of said pixel electrodes with the layer of the organic compound.

9. The method of claim 8 wherein the mask substantially covers said gap and leaves a space over said pixel electrodes.

10. A method according to claim 1, wherein said process results in the level of the surface of the pixel electrodes being substantially the same as the level of the surface of the dielectric material in the gap.

11. A method according to claim 1, wherein said process results in the level of the surface of the pixel electrodes being lower than the level of the surface of the dielectric material in the gap.

12. A method according to claim 1, wherein the substrate is a silicon substrate.

13. A method according to claim 12, wherein the substrate comprises an integrated circuit fabricated with MOS technology.

14. A method according to claim 1, wherein said process results in the dielectric material being thinner than an adjacent pixel electrode, at least over a portion of the surface of the gap.

15. A method according to claim 1, further comprising covering the plurality of pixel electrodes and the dielectric material with said organic compound layer so as to form said OLED.

* * * * *